US011699690B2

(12) United States Patent
Shih et al.

(10) Patent No.: US 11,699,690 B2
(45) Date of Patent: Jul. 11, 2023

(54) DISPLAY DEVICE AND MANUFACTURING METHOD THEREOF

(71) Applicant: Innolux Corporation, Miao-Li County (TW)

(72) Inventors: Jian-Jung Shih, Miao-Li County (TW); Tsau-Hua Hsieh, Miao-Li County (TW); Fang-Ying Lin, Miao-Li County (TW); Kai Cheng, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 65 days.

(21) Appl. No.: 17/167,107

(22) Filed: Feb. 4, 2021

(65) Prior Publication Data

US 2021/0257343 A1    Aug. 19, 2021

Related U.S. Application Data

(60) Provisional application No. 62/978,305, filed on Feb. 19, 2020.

(30) Foreign Application Priority Data

Nov. 10, 2020  (CN) .......................... 202011249624.9

(51) Int. Cl.
*H01L 25/075* (2006.01)
*H01L 21/66* (2006.01)
*H01L 25/16* (2023.01)

(52) U.S. Cl.
CPC .......... *H01L 25/0753* (2013.01); *H01L 22/22* (2013.01); *H01L 25/167* (2013.01)

(58) Field of Classification Search
None
See application file for complete search history.

(56) References Cited

U.S. PATENT DOCUMENTS

| | | | |
|---|---|---|---|
| 2014/0267683 A1 | 9/2014 | Bibl et al. | |
| 2016/0217720 A1* | 7/2016 | Chaji | ..................... G09G 3/006 |
| 2018/0342492 A1 | 11/2018 | Lu | |
| 2019/0080970 A1* | 3/2019 | Chaji | .................. H05B 45/325 |
| 2020/0168585 A1 | 5/2020 | Lo et al. | |

FOREIGN PATENT DOCUMENTS

| | | |
|---|---|---|
| CN | 110289280 | 9/2019 |
| EP | 3425618 | 1/2019 |
| KR | 20190079147 | 7/2019 |

OTHER PUBLICATIONS

"Search Report of Europe Counterpart Application", dated Jun. 28, 2021, pp. 1-8.
"Office Action of Europe Counterpart Application", dated May 9, 2023, p. 1-p. 6.

* cited by examiner

*Primary Examiner* — Elmito Breval
(74) *Attorney, Agent, or Firm* — JCIPRNET

(57) ABSTRACT

A display device is provided in an embodiment in the disclosure, including a subpixel region, a spacer, a light-emitting element, and a driving circuit. The spacer separates the subpixel region into a first region and a second region. The light-emitting element is located in at least one of the first region or the second region. The driving circuit is electrically connected to the first region and the second region, so as to drive the light-emitting element. A manufacturing method of the display device is also disclosed.

18 Claims, 13 Drawing Sheets

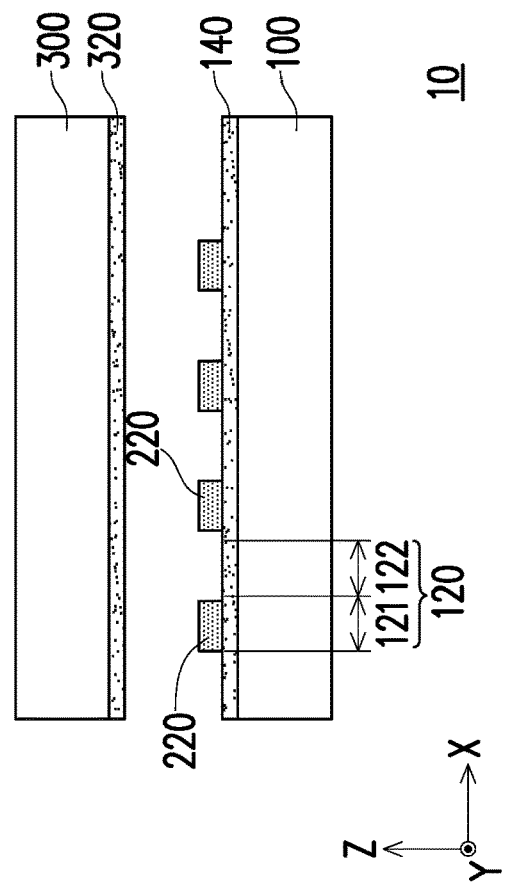
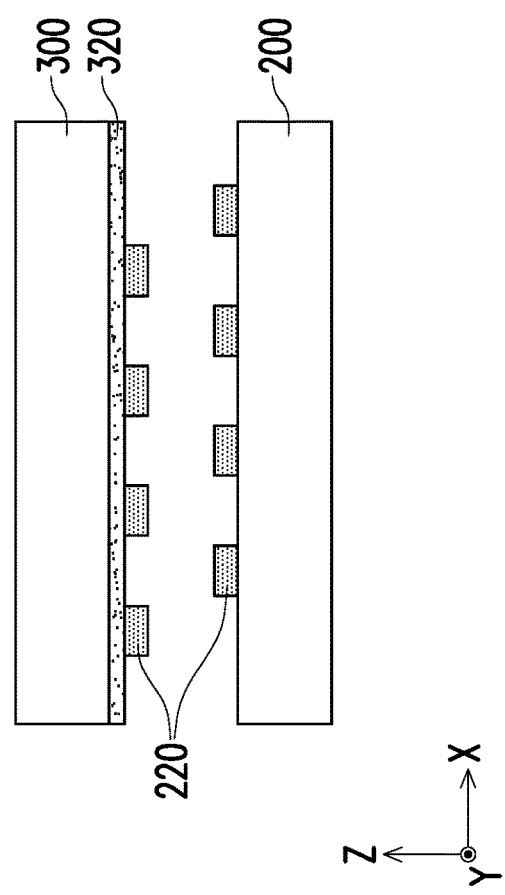
FIG. 2B
FIG. 2A

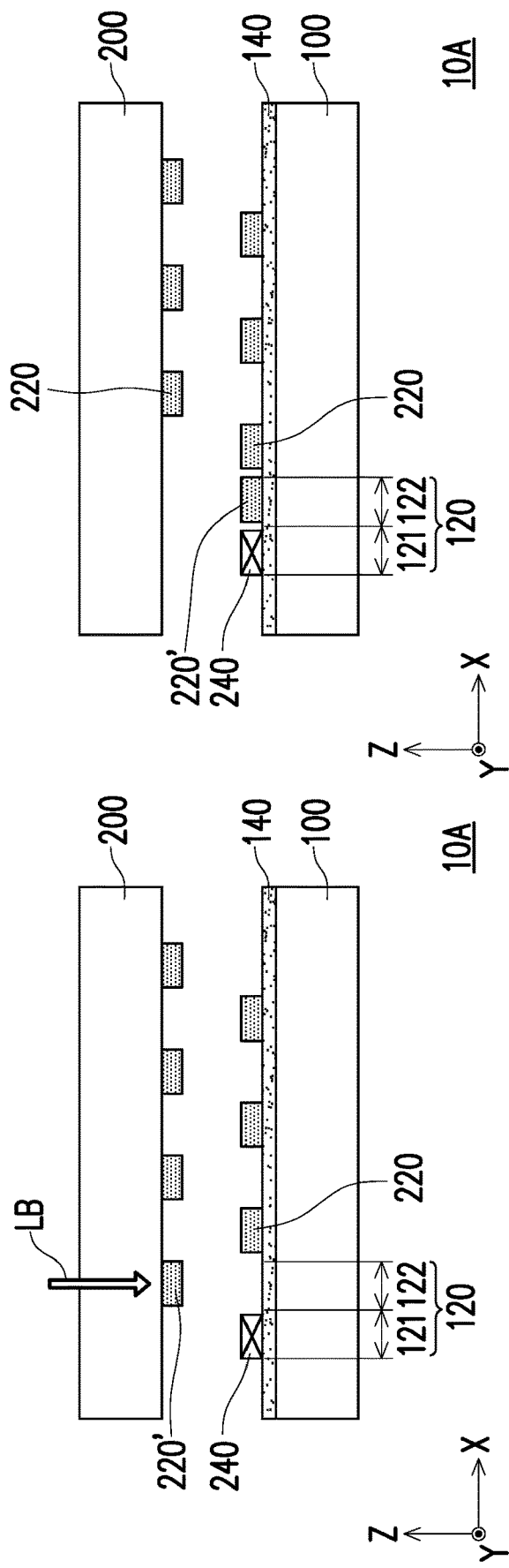

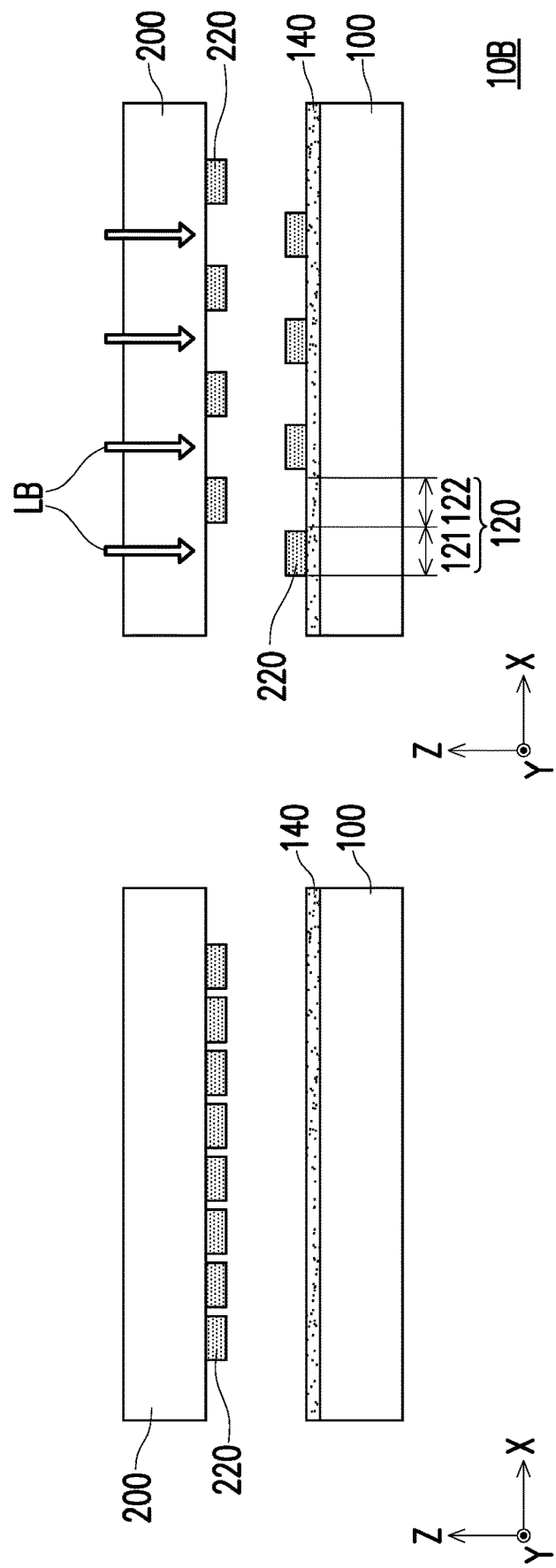

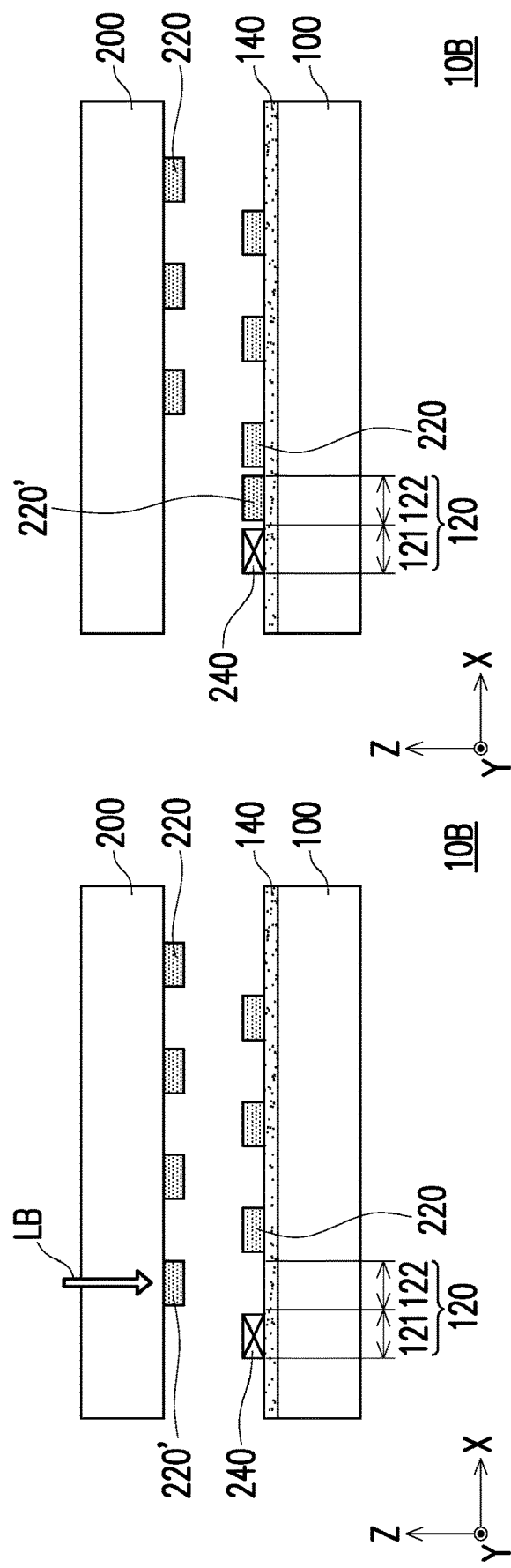

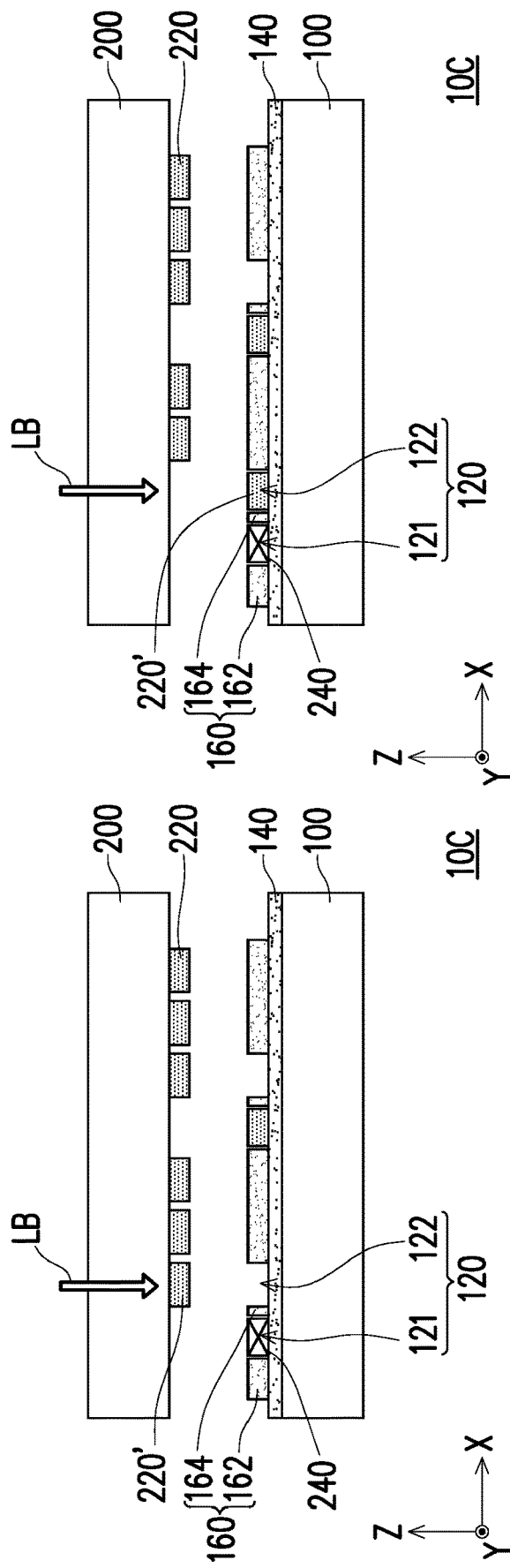

DISPLAY DEVICE AND MANUFACTURING METHOD THEREOF

CROSS-REFERENCE TO RELATED APPLICATION

This application claims the priority benefit of U.S. provisional application Ser. No. 62/978,305, filed on Feb. 19, 2020, and China application serial no. 202011249624.9, filed on Nov. 10, 2020. The entirety of each of the patent applications is hereby incorporated by reference herein and made a part of this specification.

BACKGROUND

Technical Field

The disclosure relates to a display device and a manufacturing method thereof.

Description of Related Art

The transfer of light-emitting units (e.g., light-emitting diodes (LED)) is a key step in the method for manufacturing electronic devices with display functions. Several methods for transferring LEDs between different substrates have been proposed. However, due to the limited information on LED transfer technology, the knowledge of LED mass transfer process, selective transfer or repair transfer process is still insufficient and encounters different problems. Therefore, the research and development of electronic devices must be continuously updated and adjusted.

SUMMARY

The disclosure is directed to a display device with which costs may be reduced or good display quality may be ensured, but the disclosure is not limited thereto.

According to an embodiment in the disclosure, a display device includes a subpixel region, a spacer, a light-emitting element, and a driving circuit. The spacer separates the subpixel region into a first region and a second region. The light-emitting element is located in at least one of the first region or the second region. The driving circuit is electrically connected to the first region and the second region to drive the light-emitting element.

Based on the above, in the embodiments in the disclosure, the display device includes the spacer to separate the first region from the second region, so when the light-emitting element is transferred, the light-emitting element may be disposed in the first region or the second region surrounded by the spacers to achieve exact positioning. Moreover, since the adjacent light-emitting elements may be separated by the spacers, the impact on the arrangement of the adjacent light-emitting elements may be reduced. Moreover, since the adjacent light-emitting elements may be separated by the spacers, the problem of light mixing caused by the adjacent light-emitting elements when emitting light may be improved, or the light quality of the image may be improved. Based on the above, the display device has good display quality. Moreover, the display device of the embodiment in the disclosure may selectively repair the subpixel region to reduce the number of light-emitting elements that need to be transferred. Therefore, with the display device, the requirement of cost may be reduced. The embodiments in the disclosure may have some or all of the above advantages, but may also have other advantages, and the disclosure is not limited thereto.

BRIEF DESCRIPTION OF THE DRAWINGS

FIG. 2A to FIG. 2B are schematic cross-sectional views of a display device performing a mass transfer process according to an embodiment of the disclosure.

FIG. 3A to FIG. 3B are schematic cross-sectional views of a display device performing a repair transfer process according to another embodiment of the disclosure.

FIG. 4A to FIG. 4B are schematic cross-sectional views of a display device performing a mass transfer process according to another embodiment of the disclosure.

FIG. 4C to FIG. 4D are schematic cross-sectional views of a display device performing a repair transfer process according to another embodiment of the disclosure.

FIG. 6C to FIG. 6D are schematic cross-sectional views of a display device performing a repair transfer process according to yet another embodiment of the disclosure.

DESCRIPTION OF THE EMBODIMENTS

Figure 1A:
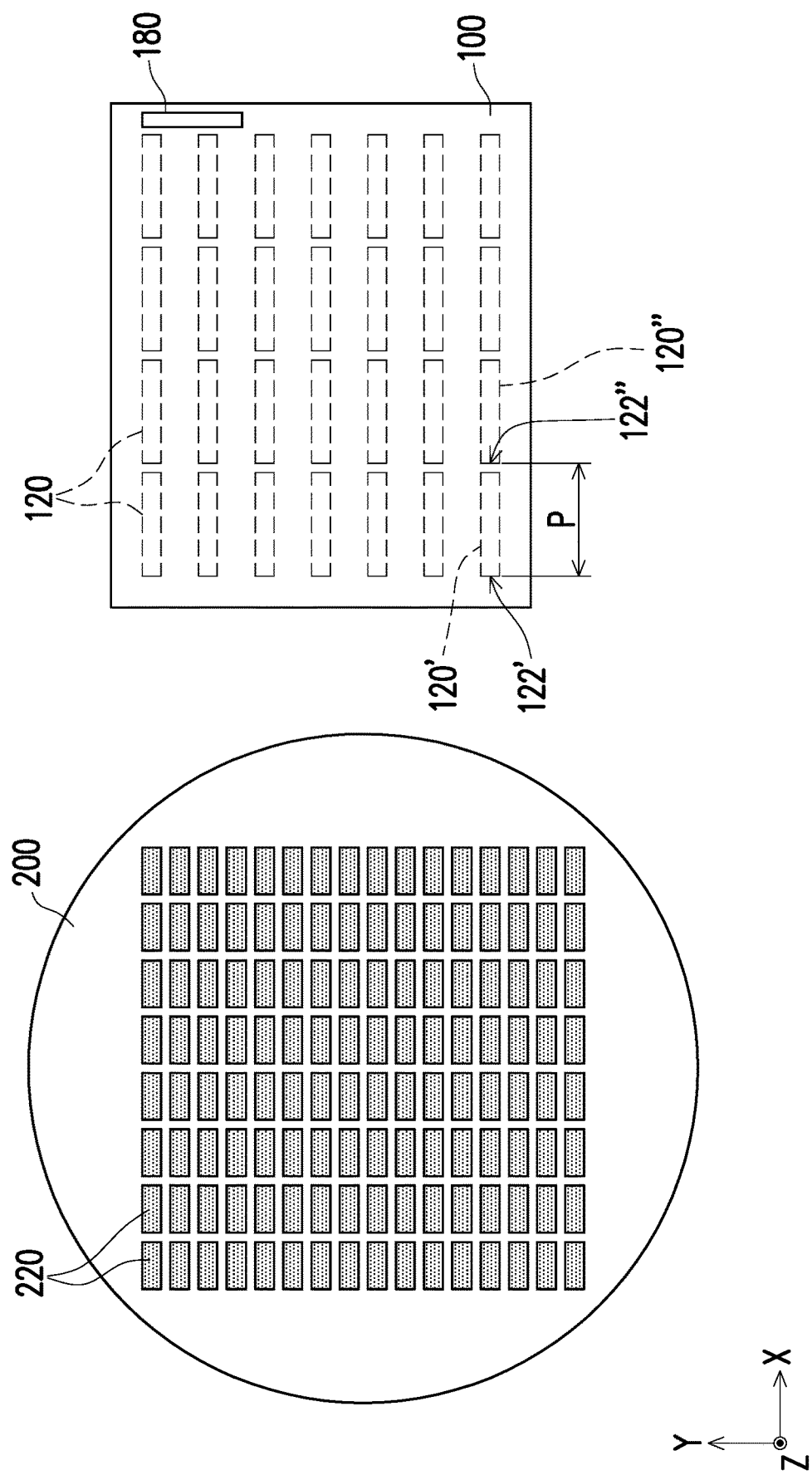
FIG. 1A to 1C are schematic top views of a manufacturing process of a display device according to an embodiment of the disclosure.

With reference to the detailed description below and in combination with the drawings, it is noted that for comprehension of the reader and simplicity of the drawings, in the drawings of the disclosure, only a part of the electronic device is shown, and specific elements in the drawings are not necessarily drawn to scale. Moreover, the quantity and the size of each element in the drawings are only schematic and are not intended to limit the scope of the disclosure.

Throughout the specification and the appended claims of the disclosure, certain terms are used to refer to specific elements. Those skilled in the art should understand that electronic device manufacturers may probably use different names to refer to the same elements. This specification is not intended to distinguish between elements that have the same function but different names. In the following specification and claims, the terms "including", "containing", "having", etc., are open-ended terms, so they should be interpreted to mean "including but not limited to . . . ". Therefore, when the terms "including", "containing", "having", etc. are used in the description in the disclosure, they refer to corresponding features, regions, processes, operations and/or elements, but they do not exclude one or multiple corresponding features, regions, processes, operations and/or elements.

In the following embodiments, wordings used to indicate directions, such as "up," "down," "front," "back," "left," and "right," merely refer to directions in the accompanying drawings. Therefore, the used directional terminology is only intended to illustrate, rather than limit, the disclosure. In the accompanying drawings, each drawing illustrates the general features of the methods, structures, and/or materials used in specific embodiments. However, the drawings should not be construed as defining or limiting the scope or nature covered by the embodiments. For example, for clarity, a relative size, a thickness, and a location of each film layer, region, and/or structure may be reduced or enlarged.

It should be understood that when a element or a film layer is described as being "connected to" another element or film layer, it may be directly connected to the another element or film layer, or there is an intervening element or film layer therebetween. When a element is described as being "directly connected" to another element or film layer, there is no intervening element or film layer therebetween. Moreover, when a element is described as being "coupled to another element (or a variant thereof)", the element may be directly connected to the another element, or indirectly connected (e.g., electrically connected) to the another element via one or more elements.

In the disclosure, the length and width can be measured by using an optical microscope, and the thickness can be measured based on a cross-sectional image in an electron microscope, but not limited thereto. Moreover, any two values or directions used for comparison may have certain errors.

The terms such as "about", "equal", "same", "substantially", or "approximately" are generally interpreted as being within a range of plus or minus 20% of a given value or range, or as being within a range of plus or minus 10%, plus or minus 5%, plus or minus 3%, plus or minus 2%, plus or minus 1%, or plus or minus 0.5% of the given value or range.

A structure (or layer, element, substrate) on/above/moved onto another structure (or layer, element, substrate) described in the present disclosure may mean that two structures are adjacent and directly connected, or may mean that two structures are adjacent and indirectly connected. Indirect connection means that there is at least one intermediate structure (or intermediate layer, intermediate element, intermediate substrate, intermediate spacing) between two structures, the lower surface of a structure is adjacent or directly connected to the upper surface of the intermediate structure, and the upper surface of the other structure is adjacent or directly connected to the lower surface of the intermediate structure. The intermediate structure may be a single-layered or multi-layered physical structure or non-physical structure, which is not limited. In the present disclosure, when a structure is disposed "on" another structure, it may mean that a structure is "directly" disposed on another structure, or a structure is "indirectly" disposed on another structure, that is, at least one structure is sandwiched between a structure and another structure.

The terms such as "first", "second", and the like in this specification may be used for describing various elements, elements, areas, layers, and/or parts, but the elements, elements, areas, layers, and/or parts are not limited by such terms. The terms are only used to distinguish one element, element, area, layer, or part from another element, element, area, layer, or part. Therefore, a "first element", "first element", "first region", "first layer", or "first part" discussed below is used to distinguish it from a "second element", "second element", "second region", "second layer", or "second part", and is not used to define an order or a specific element, element, region, layer and/or part.

In the present disclosure, various embodiments described below may be used in any combination without departing from the spirit and scope of the present disclosure, for example, some features of one embodiment may be combined with some features of another embodiment to form another embodiment.

In the disclosure, the features of multiple embodiments to be described below may be replaced, recombined, or mixed to form other embodiments without departing from the spirit of the disclosure. The features of multiple embodiments may be used in combination as long as such combination does not depart from the spirit of the disclosure or lead to conflict.

Reference will now be made in detail to the exemplary embodiments of the disclosure, examples of which are illustrated in the accompanying drawings. Whenever possible, the same reference numerals are used to represent the same or similar parts in the accompanying drawings and description.

The electronic device in the disclosure may include a display device, an antenna device, a sensing device, a light-emitting device, a splicing device, a transparent display device, or a combination thereof but the disclosure is not limited thereto. The electronic device may be a bendable or flexible electronic device. The electronic device may be a bendable or flexible electronic device. The electronic device may, for example, include liquid crystals, light-emitting diodes (LEDs), or quantum dots (QDs). The light-emitting diodes may include, for example, organic light-emitting diodes (OLEDs), mini LEDs, micro LEDs, or quantum dot light-emitting diodes (QLEDs, QDLEDs), fluorescence, phosphors, other suitable materials, or a combination thereof, but the disclosure is not limited thereto. A display device is configured as an electronic device to illustrate the content of the disclosure in the following, but the disclosure is not limited thereto. The antenna device may be, for example, a liquid crystal antenna, but the disclosure is not limited thereto. The splicing device may be, for example, a display splicing device or an antenna splicing device, but the disclosure is not limited thereto. It should be noted that the electronic device may be any combination of the above arrangements, but the disclosure is not limited thereto. It should be noted that the electronic device may be any combination thereof, but not limited thereto. Moreover, the electronic device may be in a rectangular shape, a circular shape, a polygonal shape, a shape with curved edges, or other suitable shapes. The electronic device may have peripheral systems such as a driving system, a control system, a light source system, a shelf system, etc. to support the display device, the antenna device, or the spliced device.

Figure 1B:
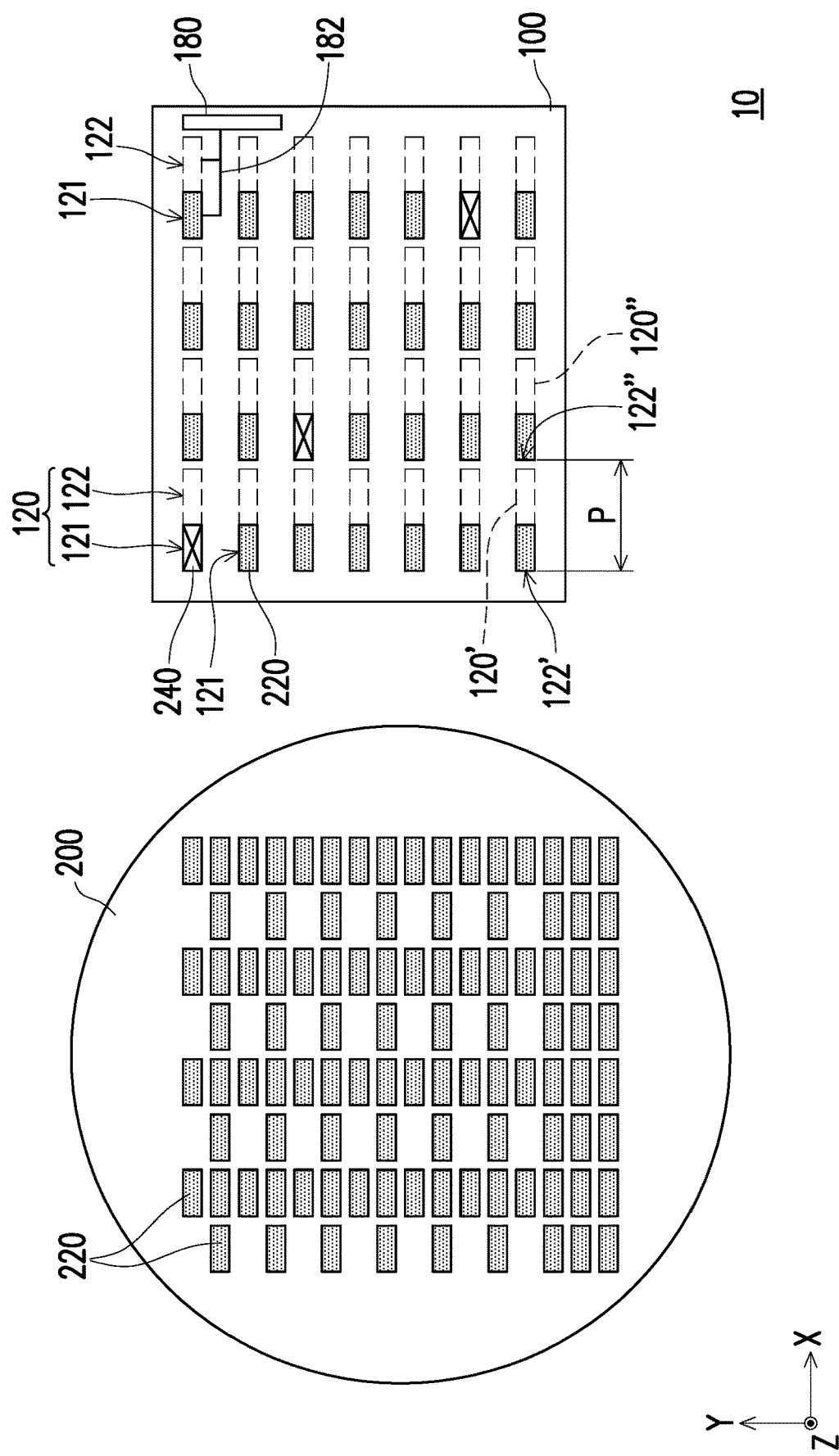
Figure 1C:
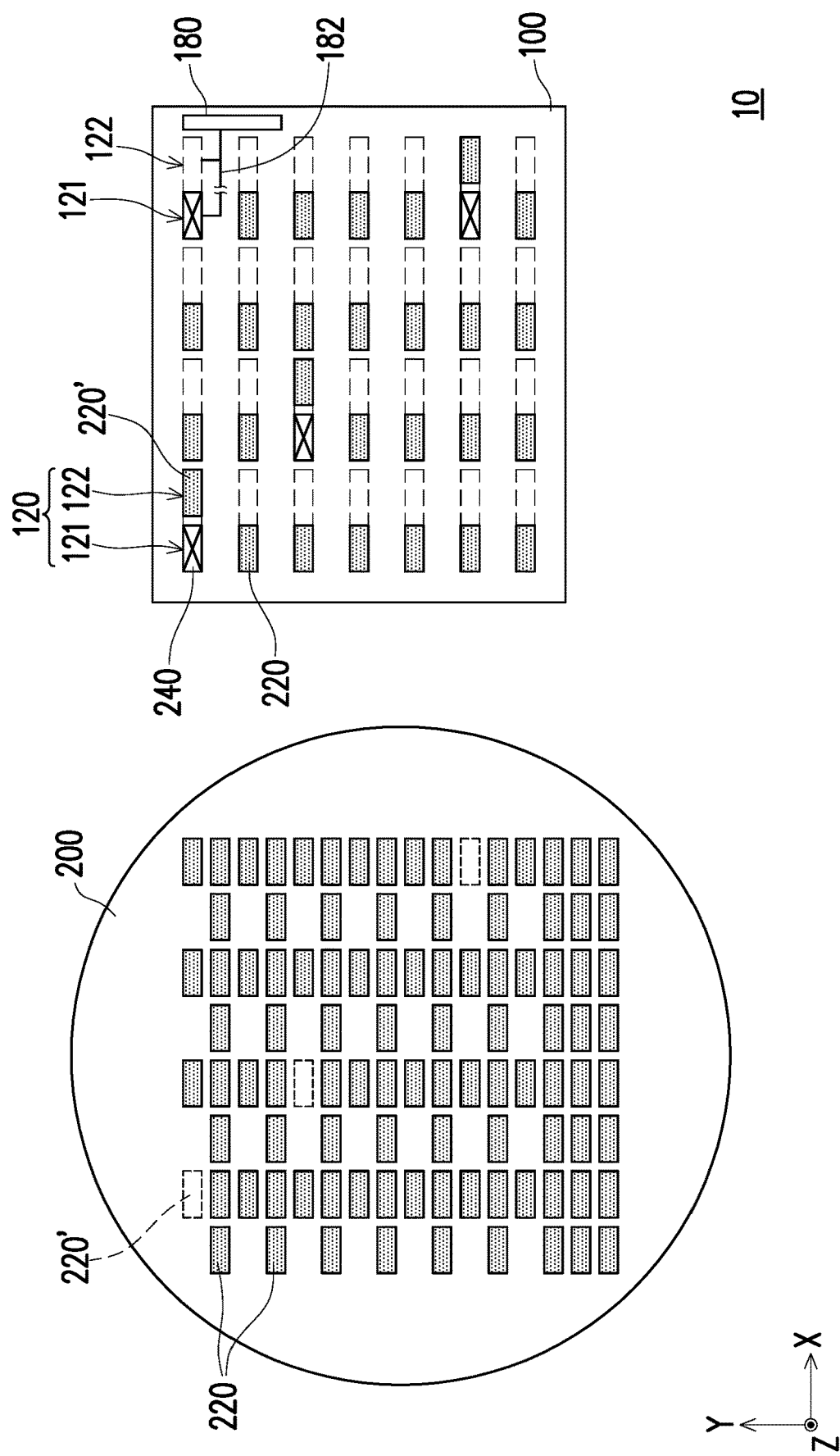
Figure 2D:
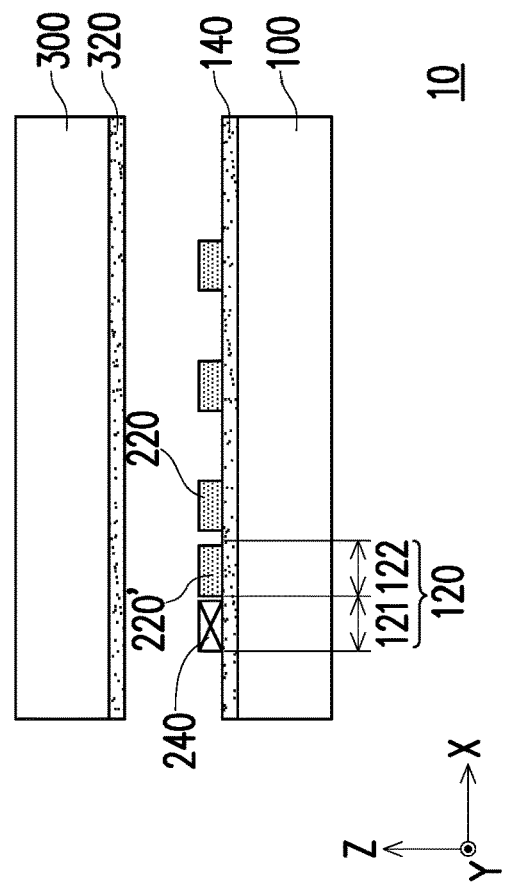
FIG. 2C to FIG. 2D are schematic cross-sectional views of a display device performing a repair transfer process according to an embodiment of the disclosure.
Figure 2C:
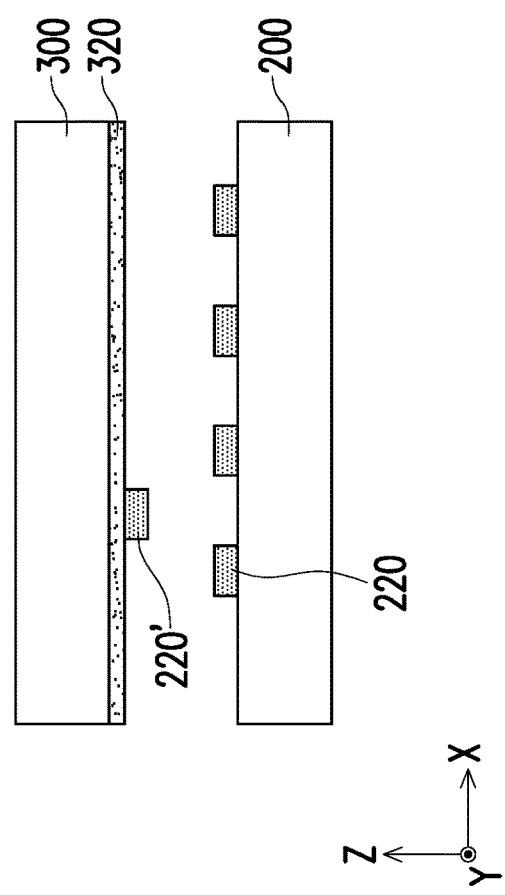

FIG. 1A to 1C are schematic top views of a manufacturing process of a display device according to an embodiment of the disclosure. FIG. 2A to FIG. 2B are schematic cross-sectional views of a display device performing a mass transfer process according to an embodiment of the disclosure. FIG. 2C to FIG. 2D are schematic cross-sectional views of a display device performing a repair transfer process according to an embodiment of the disclosure. For the clarity of the drawings and the convenience of description, some elements are omitted in FIG. 1A to FIG. 1C, FIG. 2A to FIG. 2B, and FIG. 2C to FIG. 2D. Referring to FIG. 1A, FIG. 1B, and FIG. 1C, a display device 10 includes a substrate 100, a plurality of subpixel regions 120, a plurality of light-emitting elements 220, and a driving circuit 180. In the embodiment, the plurality of light-emitting elements 220 may be respectively disposed in the subpixel regions 120, and the driving circuit 180 may be electrically connected to the plurality of light-emitting elements 220 and drive the light-emitting elements 220. The light-emitting element 220 may emit light after being driven to produce an image. In this way, the display device 10 may be capable of having a good display quality. The manufacturing process of the display device 10 is briefly described below.

Referring to FIG. 1A, in the manufacturing process of the display device 10, the substrate 100 is first provided. According to different requirements, the substrate 100 may be a rigid substrate or a flexible substrate. The material of the substrate 100 includes, for example, glass, quartz, ceramic, sapphire, or plastic, but the disclosure is not limited thereto. In another embodiment, the material of the substrate 100 may include a suitable opaque material. In some embodiments, when the substrate 100 is a flexible substrate, it may include suitable flexible materials, such as polycarbonate (PC), polyimide (PI), polypropylene (PP) or polyethylene terephthalate (PET), other suitable materials or a combination thereof, but the disclosure is not limited thereto. In an embodiment, the substrate 100 may be a single-layered or multi-layered structure, but the disclosure is not limited thereto. Moreover, the light transmittance of the substrate 100 is not limited, that is, the substrate 100 may be a transparent substrate, a translucent substrate, or a non-transparent substrate.

In some embodiments, multiple insulating layers and/or dielectric layers (not shown) may be laminated on the substrate 100. The insulating layer and/or the dielectric layer may be a single-layered or multi-layered structure and may include, for example, organic materials (e.g., silicon nitride, etc.), inorganic materials, or a combination thereof, but the disclosure is not limited thereto.

In the embodiment, the driving circuit 180 may be disposed on the substrate 100. The driving circuit 180 may include active elements, passive elements or wires, or other suitable elements, but the disclosure is not limited thereto. In this way, the substrate 100 may also be referred to as a driving substrate. In the embodiment, the driving circuit 180 may be electrically connected to the subpixel region 120 to drive the light-emitting elements 220 subsequently disposed in the subpixel region 120, which is described in the following description. Note that the driving circuit 180 in the drawing is only an illustration, and the actual driving circuit 180 is not limited to being located only in the peripheral region of the substrate 100. For example, the driving circuit may include a plurality of transistors (not shown), and the transistors may be disposed in the subpixel regions 120 to drive the light-emitting elements 220, but the disclosure is not limited thereto.

As shown in FIG. 1A, a plurality of subpixel regions 120 are defined on the substrate 100. In the embodiment, the subpixel region 120 may be defined as a region where the light-emitting elements 220 are subsequently disposed on the substrate 100, but the disclosure is not limited thereto. The subpixel regions 120 may be arranged into a plurality of rows substantially along the X-axis direction and a plurality of columns substantially along the Y-axis direction. In other words, the plurality of subpixel regions 120 may define the light-emitting elements 220 to be subsequently disposed as a pattern substantially arranged in an array, but the embodiment is not limited thereto. In the embodiment, the X axis is substantially perpendicular to the Y axis or the Z axis, and the Y axis is substantially perpendicular to the X axis or the Z axis.

In the embodiment, a pitch P of each of the subpixel regions 120 may be defined as a distance between one side 122' of one subpixel region 120' and one side 122" of another subpixel region 120" adjacent to the subpixel region 120' along the X axis, such as the shortest distance. The pitch P of the subpixel region 120 may be greater than or equal to 1 micrometer and less than or equal to 1200 micrometers (1 µm≤P≤1200 µm), such as 10 micrometers, 100 micrometers, 500 micrometers, or 1000 micrometers, but the embodiment is not limited thereto.

Next, a plurality of light-emitting elements 220 are provided. The light-emitting elements 220 may be disposed or formed on a wafer 200 (e.g., a sapphire growth substrate) or a carrier 300, but the disclosure is not limited thereto. As shown in FIG. 1A and FIG. 2A, a plurality of light-emitting elements 220 may be formed on the wafer 200. The position of the light-emitting element 220 on the wafer 200 may substantially correspond to the position of the subpixel region 120. In some embodiments, the position of the light-emitting element 220 on the wafer 200 may not correspond to the position of the subpixel region 120. For example, each light-emitting element 220 may be, for example, a light-emitting diode (LED), an organic light-emitting diode, or a micro light-emitting diode (micro LED), but the disclosure is not limited thereto. Moreover, the light-emitting element 220 may be, for example, an organic light-emitting element or an inorganic light-emitting element. The structure of the micro light-emitting element 220 may be a P-N diode, a P-I-N diode, or other suitable structures, but the disclosure is not limited thereto. The light-emitting element 220 may include an organic material (e.g., an organic polymer light-emitting material, an organic small molecule light-emitting material, an organic complex light-emitting material, or other suitable materials, or a combination thereof), an inorganic material (e.g., perovskite materials, rare earth ion luminescent materials, rare earth fluorescent materials, semiconductor luminescent materials, or other suitable materials, or a combination thereof), or other suitable materials, or a combination thereof.

In the embodiment, a plurality of light-emitting elements 220 may be transferred to the substrate 100 through the carrier 300. Referring to FIG. 1B, FIG. 2A and FIG. 2B, an adhesive layer 320 may be disposed on the carrier 300. The carrier 300 may be close to the wafer 200 and the adhesive layer 320 contacts the light-emitting elements 220 to selectively attach or bond the light-emitting elements 220 to the adhesive layer 320 of the carrier 300.

Then, a selective transfer process is performed, which includes moving the carrier 300 to be on the substrate 100, and correspondingly disposing the selected light-emitting elements 220 in the subpixel region 120 on the substrate 100. In the embodiment, an adhesive layer 140 is disposed on the substrate 100 to attach or bond a plurality of light-emitting elements 220 to the adhesive layer 140. In some embodiments, the plurality of light-emitting elements 220 may be bonded to the substrate 100 through other metal bonding methods. In this way, the selective transfer process of transferring the plurality of light-emitting elements 220 from the wafer 200 to the substrate 100 is completed, but not limited thereto. The selective transfer process is also referred to as a mass selective transfer process, and the carrier 300 may also be referred to as a mass transfer process carrier, but it is not limited thereto.

In other embodiments, the selective transfer process may be performed not through the carrier 300, but the multiple light-emitting elements 220 on the wafer 200 are directly transferred to the substrate 100, and the disclosure is not limited thereto.

In the embodiment, the method of transferring the light-emitting elements 220 from the carrier 300 to the substrate 100 includes bonding or fixing the light-emitting elements 220 to the substrate 100 by the adhesive force of the adhesive layer 140, but it is not limited thereto. In some embodiments, the carrier 300 may also bond the light-emitting element 220 to the carrier 300 by means of electrostatic force or magnetic force. Then, the light-emitting elements 220 are placed on the substrate 100. In the embodiment, the method used in the transfer process may also be referred to as pick and place technology, but the disclosure is not limited to the use of the method for the transfer process. For example, a metal bonding method may be used.

Referring to FIG. 1B, the subpixel region 120 may define a first region 121 and a second region 122. The first region 121 and the second region 122 may be defined as two adjacent regions which are separated in the subpixel region 120 along the X axis. In some embodiments, the total area of the first region 121 and the second region 122 in the top view (or on the Z axis) is less than or equal to the area of the subpixel region 120. The area of the first region 121 and the area of the second region 122 may be substantially the same or different, and the embodiment is not limited thereto. That is, the area of the first region 121 may be greater than, equal to, or less than the area of the second region 122.

After the transfer process, the light-emitting elements 220 may be transferred to the first regions 121. In other words, one first region 121 is capable of accommodating at least one light-emitting element 220. Under the configuration, the first region 121 may also be referred to as a subpixel predetermined region, and the second region 122 may be used as a redundant region, but it is not limited thereto. As shown in FIG. 1B, the light-emitting element 220 may correspond to the first region 121 of the subpixel region 120 and is disposed on the substrate 100 in an array.

In some implementations, multiple pads (not shown) may be disposed in the first region 121 or the second region 122 respectively. The electrode of the light-emitting element 220 may be bonded to the pads. The driving circuit 180 may be electrically connected to the first region 121 and the second region 122 through wire(s) 182, and the wire(s) 182 may be electrically connected to the pads, but the disclosure is not limited thereto. Under the configuration, the driving circuit 180 may be electrically connected to the light-emitting element 220 through the multiple pads to drive the light-emitting element 220. Accordingly, the light-emitting element 220 may emit light, and the display panel 10 having a plurality of light-emitting elements 220 can display an image pattern.

As shown in FIG. 1B, the number of light-emitting elements 220 accommodated in each of first region 121 may be one, but the disclosure is not limited thereto. In some embodiments, the number of light-emitting elements 220 accommodated in the first region 121 may be greater than or equal to 1, for example, two, three, four, or more, depending on the needs of the user.

Next, after completing at least a part of the transfer process, a defect inspection is performed to inspect whether the no good (NG) light-emitting element(s) 240 is in the first region 121. In the embodiment, the term "NG" is defined as failing to meet the inspection specifications. For example, the NG light-emitting element 240 may emit light beyond the preset average brightness (i.e., too bright), emit light below the preset average brightness (i.e., too dark), or not emit light (i.e., not light up), so it is considered as failing to meet the inspection specifications, but the disclosure is not limited thereto. Alternatively, the NG light-emitting element 240 may be damaged, resulting in a defective appearance, and thus it is determined that it fails to meet the inspection specifications. Moreover, the size of the NG light-emitting element 240 greater than the preset average size or less than the preset average size may be also regarded as failing to meet the inspection specifications, but the embodiment is not limited thereto. In some embodiments, the absence of the light-emitting element(s) in the first region 121 may also be regarded as failing to meet the inspection specifications, but the disclosure is not limited thereto.

The method of defect inspection includes supplying power to the substrate 100 so that the light-emitting element 220 emits light, and positioning the NG light-emitting element(s) 240 through an observation of a detection device (not shown). For example, the detection device may include an optical unit and a data processing unit. The optical unit is, for example, a charge-coupled device (CCD) camera, but the disclosure is not limited thereto. The data processing unit is, for example, a computer, but the disclosure is not limited thereto. When performing the defect detection, the optical element senses the light emitted by the light-emitting elements 220 to generate a sensing signal, and then the optical element transmits the sensing signal to the data processing unit for analysis. Accordingly, the light-emitting element(s) 240 defined as NG is inspected and positioned. In some embodiments, the optical unit may determine whether the light-emitting element 220 is defective or whether its size is greater or less than a preset average size through observing the appearance of the light-emitting element 220 to determine whether the light-emitting element 220 is an NG light-emitting element 240. In other embodiments, the optical unit may observe whether a light-emitting element is disposed in the first region 121. If no light-emitting element is disposed in the first region 121, the inspection device may determine that there is a defect, but the disclosure is not limited thereto.

In some embodiments, the method of defect inspection further includes supplying power to the substrate 100 so that the light-emitting element 220 emits light, and then a detection device (not shown) is used to inspect whether the light-emitting element 220 has electrical abnormality. If the light-emitting element 220 is determined to be electrically abnormal, it may be regarded as an NG light-emitting element 240. In this way, the NG light-emitting element 240 may be inspected and positioned.

In other embodiments, the method of defect inspection further includes supplying power to the substrate 100 so that the light-emitting element 220 emits light, and with naked eyes the user may observe whether the light-emitting element 220 emits light to determine whether the light-emitting element 220 meets the inspection specification (i.e., whether it is an NG light-emitting element 240) through the inspection device (not shown). Note that the method of defect inspection is only an illustration and is not intended to limit the embodiment of the disclosure. In fact, other suitable methods for inspecting whether the light-emitting element meets the inspection specifications are also applicable to the display device 10 of the embodiment.

Refer to FIG. 1B, FIG. 1C, and FIG. 2C. Then, after the defect inspection, a selective repair transfer process is performed on the display device 10. The selective repair transfer process includes moving the carrier 300 to be close to the wafer 200, and making the adhesive layer 320 contact the light-emitting element 220' and the light-emitting element 220' is selectively transferred (e.g., attached or bonded) to the adhesive layer 320 of the carrier 300. FIG. 1C shows the wafer 200 after the light-emitting elements 220' are transferred to the carrier 300, and the selectively transferred light-emitting elements 220' are shown with a dotted line in FIG. 1C.

Refer to FIG. 2D. Then, the carrier 300 may be moved onto the substrate 100, and the selectively transferred light-emitting element 220' is correspondingly disposed on the second region 122 of the subpixel region 120 on the substrate 100. The light-emitting element 220' may be electrically connected to the pads in the second region 122. In this way, the selective repair transfer process of transferring the light-emitting element 220' from the wafer 200 to the substrate 100 is completed. The selective repair transfer process may also be referred to as a mass selective repair transfer process, but the disclosure is not limited thereto.

In other embodiments, the selective repair transfer process may be performed not through the carrier 300, and the light-emitting element 220' on the wafer 200 is directly transferred to the substrate 100. However, the disclosure is not limited thereto.

In the embodiment, the method of transferring the light-emitting element 220' from the carrier 300 to the substrate 100 includes bonding or fixing the light-emitting element 220' to the substrate 100 by the adhesive force of the adhesive layer 140, but the disclosure is not limited thereto. In some embodiments, the carrier 300 may also bond the light-emitting element 220' to the carrier 300 through electrostatic force, magnetic force, or metal bonding. Then, the light-emitting element 220' is placed on the substrate 100. In the embodiment, the transfer process methods used in the selective transfer process and the selective repair transfer process may be the same or different, but the disclosure is not limited to the methods for the transfer process.

After the repair transfer process, the light-emitting element 220' may be transferred to the second region 122. In other words, the light-emitting element 220' may be disposed in the second region 122 and adjacent to the NG light-emitting element 240 in the first region 121. In the embodiment, the second region 122 may be used as a redundant region during the repair transfer process to accommodate at least one light-emitting element 220'. As shown in FIG. 1C, the light-emitting element 220' may correspond to the second region 122 of the subpixel region 120 and is disposed on the substrate 100 in an array, but the disclosure is not limited thereto.

As shown in FIG. 1C, the number of the light-emitting elements 220' accommodated in each second region 122 may be one, but the disclosure is not limited thereto. In some embodiments, the number of the light-emitting elements 220' accommodated in the second region 122 may be greater than or equal to 0, for example, zero, one, two, three, four, or more depending on the needs of the user. For example, when the light-emitting element 220 in the first region 121 of one subpixel region 120 is a light-emitting element 220 that meets the inspection specification, the light-emitting element 220' may not be disposed in the second region 122 of the same subpixel region 120, so the number of the light-emitting elements 220' accommodated in the second region 122 may be zero.

In some embodiments, after the repair transfer process, the wire(s) 182 of the driving circuit 180 may be cut off to disconnect the wire(s) 182 electrically connected to the first region 121, but the disclosure is not limited thereto. Under the configuration, the driving circuit 180 is not electrically connected to the no good (NG) light-emitting element 240 in the light-emitting element 220. In this way, the display device 10 can have good electrical quality.

In the embodiment, the first region 121 and the second region 122 may be connected to the wire(s) 182 in parallel and electrically connected to the driving circuit 180, but the disclosure is not limited thereto. In other embodiments, the first region 121 and the second region 122 may be connected to different driving circuits 180 respectively.

In some embodiments, after the repair transfer process, the defect detection may be performed again to inspect the NG light-emitting element 240 in the second region 122. The definition of NG may include the foregoing examples which fail to meet inspection specifications, so they are not iterated herein. When the NG light-emitting element 240 is inspected in the second region 122, the repair transfer process may be performed again to transfer the light-emitting element 220' to the second region 122 and to be electrically connected to the driving circuit 180. In this way, the display device 10 with good display quality may be attained.

Note that the maximum of the total number of light-emitting elements 220 accommodated in the subpixel region 120 of the display device 10 in an embodiment of the disclosure is n, the number of light-emitting elements 220 accommodated in the first region 121 is m, and the number of light-emitting elements 220 accommodated in the second region 122 is y. The maximum n of the total number of light-emitting elements 220 accommodated in the subpixel region 120 is greater than or equal to the sum of the number m of light-emitting elements 220 in the first region 121 and the number y of light-emitting elements 220' in the second region 122 (e.g., n≥my). For example, when one NG light-emitting element 240 (i.e., m=1) is accommodated in the first region 121, at least one light-emitting element 220' (i.e., y=1) meeting the inspection specifications may be disposed in the second region 122. Therefore, the total number of light-emitting elements 220 accommodated in the subpixel region 120 may be designed as greater than or equal to 2 (i.e., n≥2). In another example, when one NG light-emitting element 240 (i.e., m=1) is accommodated in the first region 121, two light-emitting elements 220' meeting the inspection specifications (i.e., y=2) are disposed in the second region 122. Therefore, the total number of light-emitting elements 220 accommodated in the subpixel region 120 may be greater than or equal to 3 (i.e., n≥3). The examples are merely illustrative and are not intended to limit the embodiments in the disclosure.

Under the configuration, the display device 10 of the embodiment may perform a mass selective transfer process to dispose the light-emitting element 220 in the first region 121. Next, a defect detection is performed to inspect the NG light-emitting element 240. Then, a mass selective repair transfer process is performed to dispose the light-emitting element 220' in the second region 122. In this way, the subpixel region 120 of the NG light-emitting element 240 may be selectively repaired to reduce the number of light-emitting elements 220 and 220' that need to be transferred. Therefore, the requirement of cost of the display device 10 may be reduced. Moreover, the manufacturing process of the display device 10 may be simplified. Moreover, the display device 10 may have good display quality.

Other embodiments are provided below for explanation. It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content is not iterated in the following embodiments.

FIG. 3A to FIG. 3B are schematic cross-sectional views of a display device performing a repair transfer process according to another embodiment of the disclosure. For clarity of the drawings and convenience of description, some elements are omitted in FIG. 3A and FIG. 3B. The display device 10A of the embodiment is substantially similar to the display device 10 of FIG. 2C and FIG. 2D, so the same and similar elements in the two embodiments are not repeated. The main difference between the embodiment and the display device 10 is that in the selective repair transfer process, the light-emitting elements 220' on the wafer 200 may be selectively transferred to the substrate 100 directly. For example, the wafer 200 is moved onto the substrate 100, and then a laser lift-off process is performed. The laser lift-off process includes irradiating the position of the wafer 200 corresponding to the position of the light-emitting element 220' thereon with the energy beam LB. The energy beam LB may be a laser beam, but the disclosure is not limited thereto. In some embodiments, the wavelength range of the energy beam LB may range from 200 nanometers (nm) to 1064 nanometers (200 nm≤the wavelength≤1064 nm), but the disclosure is not limited thereto. In other embodiments, the wavelength of the laser beam LB may be 266 nm, 308 nm, 355 nm, 532 nm, or 1064 nm, but the disclosure is not limited thereto.

For example, under the configuration, when the wafer 200 (e.g., the growth substrate for the light-emitting elements 220) or the film layer disposed on the wafer 200 is irradiated by the energy beam LB, a chemical reaction may occur at the irradiated place, and nitrogen gas may be generated in the interface between the light-emitting elements 220 and the wafer 200, but the disclosure is not limited thereto. Therefore, the light-emitting elements 220 may be separated from the wafer 200.

In other embodiments, the light-emitting elements 220' on the wafer 200 may be transferred to the adhesive layer 320 of the carrier 300 first, and then the repair transfer process is performed on the carrier 300. For example, the carrier 300 is moved onto the substrate 100 to perform the laser lift-off process. For example, when the carrier 300 is irradiated by the energy beam LB, a chemical reaction may occur on the irradiated adhesive layer, and the adhesive force of the adhesive layer 320 is reduced or the adhesive layer 320 is evaporated (or ablated). Accordingly, the light-emitting element 220' may be separated from the carrier 300. The separated light-emitting element 220' may be bonded and fixed to the adhesive layer 140 of the substrate 100.

In some other embodiments, when the carrier 300 is irradiated by the energy beam LB of the laser, the light-emitting element 200' on the carrier 300 may receive the light impact force of the laser and is detached from the adhesive layer 320. In this way, the light-emitting element 220' may be separated from the carrier 300.

In the embodiment, the energy beam LB may irradiate on a side of the wafer 200 away from the substrate 100 along the Z axis to reduce the influence of the energy beam LB on the adhesive layer 140 of the substrate 100, but the disclosure is not limited thereto.

Under the configuration, the light-emitting element 220' may be disposed in the second region 122 and adjacent to the NG light-emitting element 240 in the first region 121. Since the display device 10A of the embodiment may selectively repair the subpixel region 120 with the NG light-emitting element 240, the requirement of cost of the display device 10A may be reduced. Moreover, the manufacturing process of the display device 10A may be simplified. Moreover, the display device 10A may have good display quality.

FIG. 4A to FIG. 4B are schematic cross-sectional views of a display device performing a mass transfer process according to another embodiment of the disclosure. FIG. 4C to FIG. 4D are schematic cross-sectional views of a display device performing a repair transfer process according to another embodiment of the disclosure. For clarity of the drawings and convenience of description, some elements are omitted in FIG. 4A to FIG. 4D. The display device 10B of the embodiment is substantially similar to the display device 10 of FIG. 2A to FIG. 2D, so the same and similar elements in the two embodiments are not iterated. The main difference between the embodiment and the display device 10 is that in performing the selective transfer process, the light-emitting element 220 on the wafer 200 may be selectively transferred to the substrate 100 directly. For example, in FIG. 4A and FIG. 4B, the wafer 200 is moved onto the substrate 100, and then the laser lift-off process is performed. In the laser lift-off process, the wafer 200 (e.g., the growth substrate of the light-emitting element 220) is irradiated by the energy beam LB, and the light-emitting element 220 may be separated from the wafer 200. The separated light-emitting element 220 may be bonded and fixed to the adhesive layer 140 of the substrate 100, and the light-emitting element 220 is disposed corresponding to the first region 121. In the embodiment, the wavelength range of the energy beam LB used in the laser lift-off process may be the same as or different from the wavelength range shown in the previous embodiment, so it is not iterated, and the embodiment is not limited thereto.

Next, after performing the defect detection, the NG light-emitting element 240 located in the first region 121 may be inspected and positioned. Then, the selective repair transfer process is performed. In the embodiment, the light-emitting elements 220' on the wafer 200 may be selectively transferred to the substrate 100 directly. For example, in FIG. 4C and FIG. 4D, the wafer 200 is moved onto the substrate 100, and then the laser lift-off process is performed. In the laser lift-off process, the wafer 200 (e.g., the growth substrate of the light-emitting element 220') is irradiated by the energy beam LB, and the light-emitting element 220' may be separated from the wafer 200. The separated light-emitting element 220' may be bonded and fixed to the adhesive layer 140 of the substrate 100, and the light-emitting element 220' is disposed corresponding to the second region 122 adjacent to NG light-emitting element 240.

In other embodiments, the light-emitting elements 220' on the wafer 200 may be transferred to the adhesive layer 320 of the carrier 300 first, and then the repair transfer process is performed on the carrier 300. For example, the carrier 300 is moved onto the substrate 100 to perform the laser lift-off process. When the carrier 300 is irradiated by the energy beam LB, the adhesive force of the adhesive layer 320 may be reduced or the adhesive layer 320 is evaporated (or ablated). Therefore, the light-emitting element 220' may be separated from the carrier 300. The separated light-emitting element 220' may be bonded and fixed to the adhesive layer 140 of the substrate 100 and disposed corresponding to the second region 122 adjacent to the NG light-emitting element 240.

Under the configuration, the light-emitting element 220' may be disposed in the second region 122 and adjacent to the NG light-emitting element 240 in the first region 121. Since the display device 10B of the embodiment may selectively repair the subpixel region 120 with the NG light-emitting element 240, with the display device 10B, the requirement of cost may be reduced. Moreover, the manufacturing process of the display device 10B may be simplified. Moreover, the display device 10B may have good display quality.

Figure 5A:
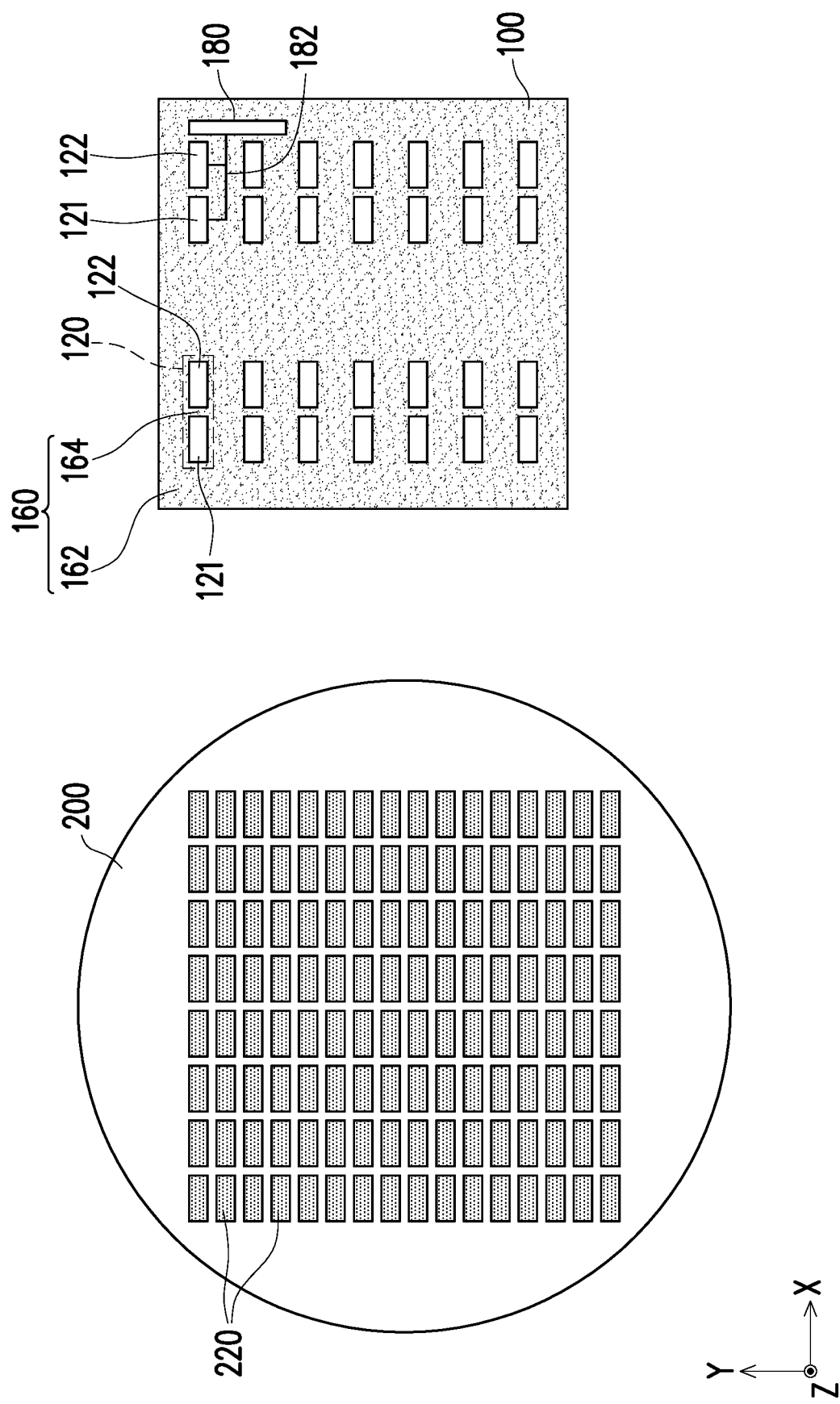
FIG. 5A to FIG. 5C are schematic top views of a manufacturing process of a display device according to yet another embodiment of the disclosure.
Figure 5B:
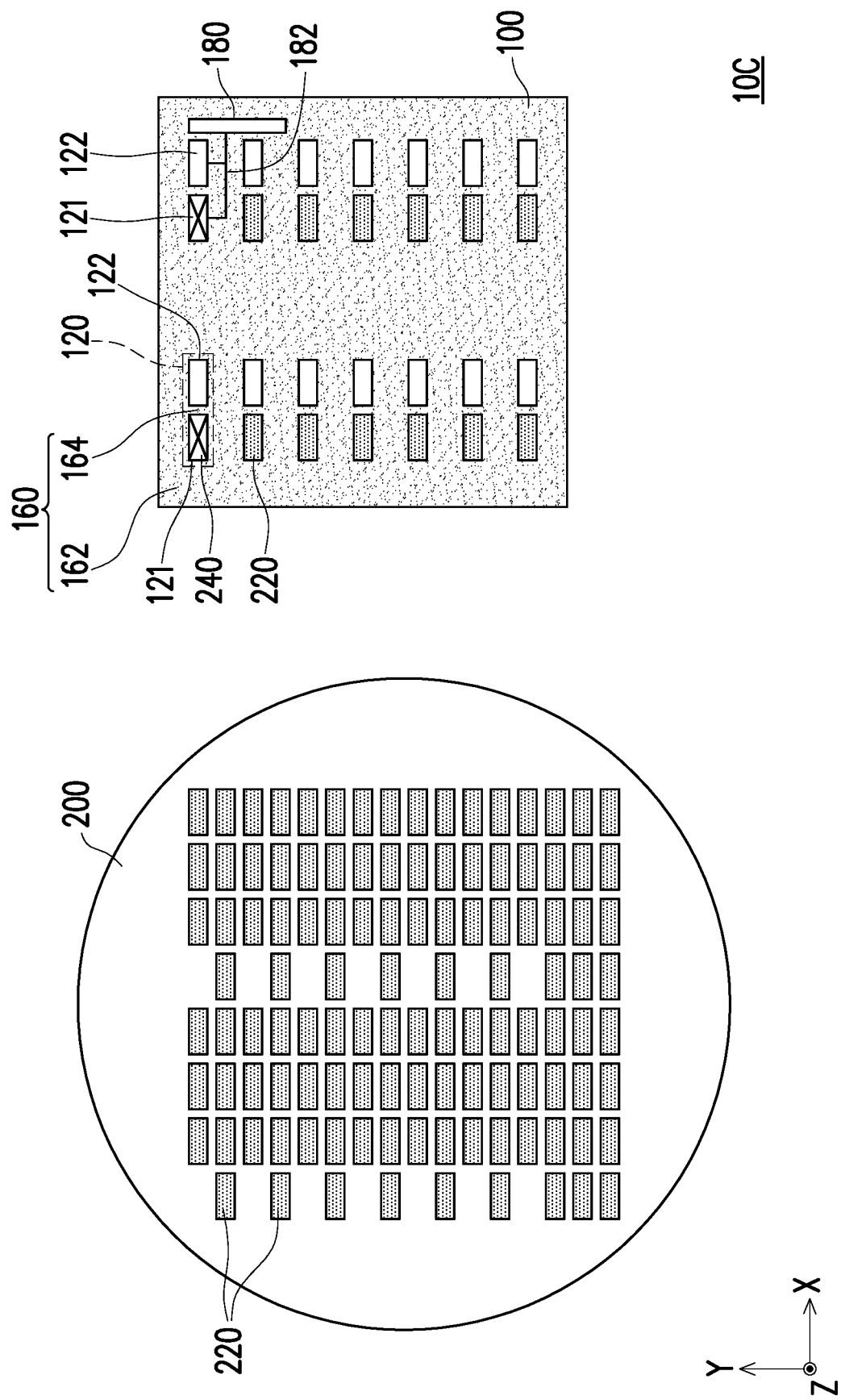
Figure 5C:
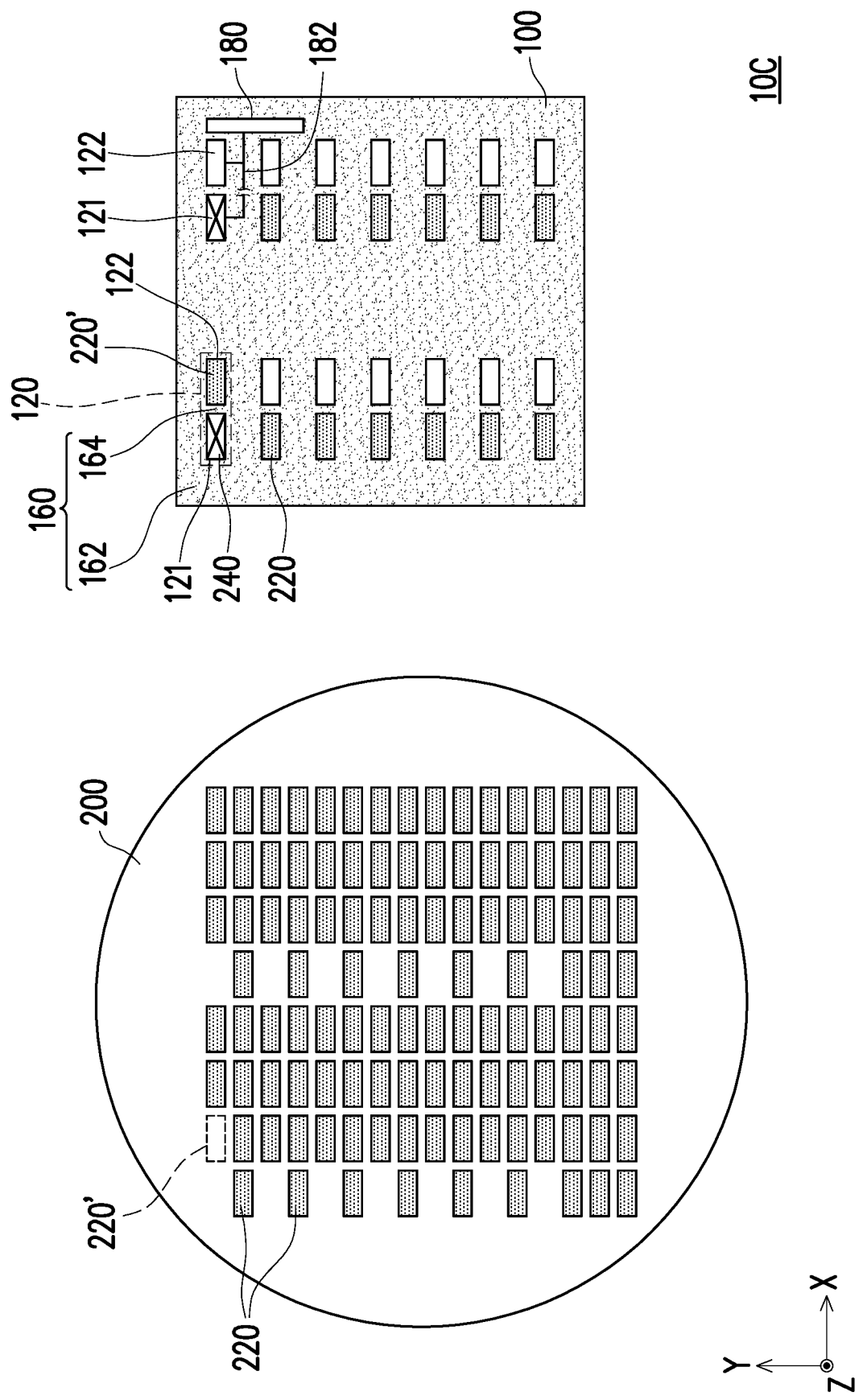
Figures 6A, 6B:
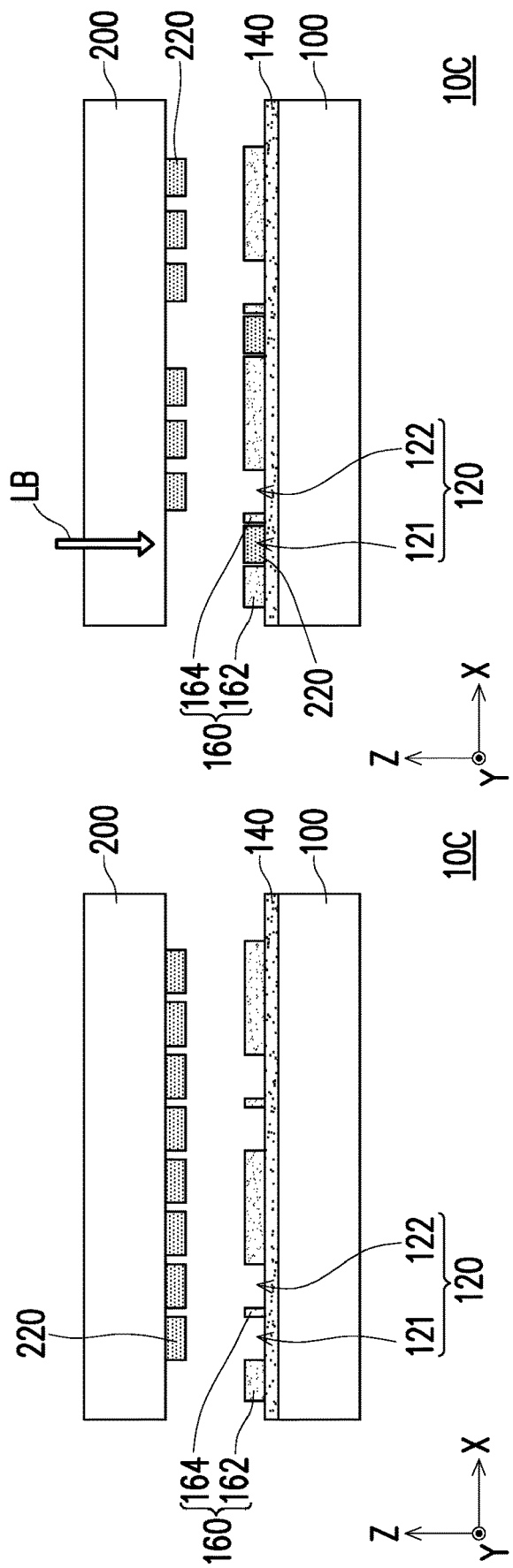
FIG. 6A to FIG. 6B are schematic cross-sectional views of a display device performing a mass transfer process according to yet another embodiment of the disclosure.

FIG. 5A to FIG. 5C are schematic top views of a manufacturing process of a display device according to yet another embodiment of the disclosure. FIG. 6A to FIG. 6B are schematic cross-sectional views of a display device performing a mass transfer process according to yet another embodiment of the disclosure. FIG. 6C to FIG. 6D are schematic cross-sectional views of a display device performing a repair transfer process according to yet another embodiment of the disclosure. For the clarity of the drawings and the convenience of description, some elements are omitted in FIG. 5A to FIG. 5C, FIG. 6A to FIG. 6B, and FIG. 6C to FIG. 6D. The display device 10C of the embodiment is substantially similar to the display device 10 of FIG. 1A to FIG. 1C and FIG. 2A to FIG. 2D, so the same and similar elements in the two embodiments are not iterated. The main difference between the embodiment and the display device 10 is that the display device 10C further includes a spacer 160. For example, the spacer 160 is disposed on the adhesive layer 140 of the substrate 100. The material of the spacer 160 includes a patternable organic material or a photoresist material. For example, the organic material includes acrylic resin, silicone, or photo resin. The spacer 160 may separate the first region 121 and the second region 122 of the subpixel region 120 through a patterning process, but the disclosure is not limited thereto. The patterning process includes spin coating process, slit coating process, printing process, or photolithography process, but the disclosure is not limited thereto.

Refer to FIG. 5A and FIG. 6A. In the embodiment, the spacer 160 may have a plurality of openings corresponding to the first region 121 and the second region 122 overlapping the subpixel region 120 after the patterning process. From another perspective, the spacer 160 may surround the first region 121 and the second region 122 of the subpixel region 120 to separate the first region 121 and the second region 122, but the disclosure is not limited thereto. In detail, the spacer 160 may include a main body portion 162 and a wall portion 164. The main body portion 162 and the wall portion 164 may surround an opening overlapping the first region 121 and the second region 122, and the wall portion 164 may be located between the first region 121 and the second region 122. In other words, the patterned spacer 160 may separate the first region 121 and the second region 122 in the subpixel region 120 through the wall portion 164 of the spacer 160. In the embodiment, the first region 121 and the second region 122 may be defined as the region projected by the opening surrounded by the main body portion 162 and the wall portion 164, but the disclosure is not limited thereto.

In the embodiment, the spacer 160 is continuous, for example. For example, the main body portion 162 and the wall portion 164 of the spacer 160 may be connected as an integral structure, and the first region 121 and the second region 122 are overlapped by an opening, but the embodiment is not limited thereto. In some embodiments, the spacer 160 may also be discontinuous. For example, the spacer 160 may include a plurality of wall portions 164 apart from one another and located between the first region 121 and the second region 122 to separate the first region 121 and the second region 122. In this way, the first region 121 and the second region 122 may be defined as two adjacent regions on the opposite sides of the wall portion 164 in the subpixel region 120.

Refer to FIG. 5A, FIG. 5B, FIG. 6A, and FIG. 6B. In selective transfer process in the embodiment, the light-emitting element 220 on the wafer 200 may be directly and selectively transferred to the substrate 100. For example, in FIG. 6A and FIG. 6B, the wafer 200 is moved onto the substrate 100, and then the laser lift-off process is performed. In the laser lift-off process, the wafer 200 (e.g., the growth substrate of the light-emitting element 220) is irradiated by the energy beam LB, and the light-emitting element 220 may be separated from the wafer 200. The separated light-emitting element 220 may be bonded and fixed to the adhesive layer 140 of the substrate 100, and the light-emitting element 220 is disposed corresponding to the first region 121. For example, the light-emitting element 220 may be disposed in an opening surrounded by the spacer 160 and surrounded by the main body portion 162 and the wall portion 164 in the first region 121.

Next, after performing the defect detection, the NG light-emitting element 240 located in the first region 121 may be inspected and positioned. Then, the selective repair transfer process is performed. In the embodiment, the light-emitting elements 220' on the wafer 200 may be selectively transferred to the substrate 100 directly. For example, in FIG. 6C and FIG. 6D, the wafer 200 is moved onto the substrate 100, and then the laser lift-off process is performed. In the laser lift-off process, the wafer 200 (e.g., the growth substrate of the light-emitting element 220') may be irradiated by the energy beam LB, and the light-emitting element 220' may be separated from the wafer 200. The separated light-emitting element 220' may be bonded and fixed to the adhesive layer 140 of the substrate 100, and the light-emitting element 220' is disposed corresponding to the second region 122 adjacent to the NG light-emitting element 240. For example, the light-emitting element 220' may be disposed in the opening surrounded by the spacer 160 and surrounded by the main body portion 162 and the wall portion 164 in the second region 122.

In other embodiments, when the selective transfer process or the selective repair transfer process is performed, a plurality of light-emitting elements 220 or light-emitting elements 220' may also be transferred to the substrate 100 through the carrier 300. The carrier 300 may bond the light-emitting element 220 to the carrier 300 through the adhesive force, electrostatic force, or magnetic force of the adhesive layer 320, and then the light-emitting element 220' is placed on the substrate 100, but the disclosure is not limited thereto.

In other embodiments, the selective transfer process or the selective repair transfer process may also be respectively and arbitrarily matched with means of adhesion, electrostatic force or magnetic force and the laser lift-off process to transfer the light-emitting element 220. The disclosure is not limited thereto.

In the embodiment, taking the display device 10C shown in FIG. 5C and FIG. 6D as an example, the subpixel region 120 accommodates the light-emitting element 220 in both the first region 121 and the second region 122 respectively. For example, the first region 121 may have an NG light-emitting element 240, and the second region 122 may have a light-emitting element 220' that is selectively repaired and transferred, but the disclosure is not limited thereto. In some embodiments, one of the light-emitting element 220 accommodated in the first region 121 and the light-emitting element 220 accommodated in the second region 122 is an NG light-emitting element 240. In other embodiments, at least one of the light-emitting elements 220 accommodated in the first region 121 and the light-emitting element 220 accommodated in the second region 122 may also be the light-emitting elements 220 and 220' meeting the inspection specifications.

In the embodiment, a light-emitting element 240 inspected as NG is disposed in the first region 121, and one of light-emitting elements 220 and 220' meeting the inspection specifications is disposed in the adjacent second region 122, but the disclosure is not limited thereto. From the foregoing description, the number of light-emitting elements 220 which the first region 121 is capable of accommodating may be greater than or equal to one. The number of light-emitting elements 220' accommodated in the second region 122 is greater than or equal to zero. In other words, when the light-emitting element 220 accommodated in the first region 121 meets the inspection specification, the light-emitting element 220' may or may not be disposed in the second region 122. In some embodiments, according to the needs of users, the first region 121 may also accommodate two or more light-emitting elements 220, and the second region 122 may also accommodate two or more light-emitting elements 220', but the disclosure is not limited thereto.

In the embodiment, after the repair transfer process, the wire 182 of the driving circuit 180 may be cut off to disconnect the wire 182 electrically connected to the first region 121, but the disclosure is not limited thereto. Under the configuration, the driving circuit 180 is not electrically connected to the NG light-emitting element 240. In this way, the display device 10C has good electrical quality. In the embodiment, the light-emitting element 220 accommodated in the first region 121 and the light-emitting element 220' accommodated in the second region 122 may be electrically connected to the driving circuit 180 in parallel, but the disclosure is not limited thereto. In other embodiments, the light-emitting element 220 accommodated in the first region 121 and the light-emitting element 220' accommodated in the second region 122 may be electrically connected to different driving circuits 180 (e.g., two different driving circuits 180) respectively.

Note that since the display device 10C of the embodiment has the spacer 160, and the spacer may separate the subpixel region 120 into the first region 121 and the second region 122, so when the light-emitting element 220 is transferred, the light-emitting element 200 may be disposed in the first region 121 or the second region 122 surrounded by the spacer 160 to achieve precise positioning. Moreover, since the adjacent light-emitting elements 220 may be separated by the spacer 160, the adjacent light-emitting elements 220 do not affect the arrangement of each other. Moreover, since the adjacent light-emitting elements 220 may be separated by the spacer 160, the problem of light mixing caused by the adjacent light-emitting elements 220 when emitting light may be improved, that is, the light quality of the image may be improved. Accordingly, the display device 10C has good display quality.

Base on the above, since the display device of the embodiment in the disclosure is capable of separating the subpixel region into the first region and the second region, performing a mass selective transfer process to dispose the light-emitting element in the first region, next performing a defect inspection to inspect NG light-emitting elements, and then performing a mass selective repair transfer process to dispose the light-emitting element in the second region, the subpixel region with the NG light-emitting element is selectively repaired to reduce the number of light-emitting elements that need to be transferred. Therefore, with the display device, the requirement of cost may be reduced. Moreover, the manufacturing process of the display device may be simplified or have good display quality. Moreover, since the display device of the embodiment in the disclosure has spacers to separate the first region from the second region, when the light-emitting element is transferred, the light-emitting element may be disposed in the first region or the second region surrounded by the spacer to achieve precise positioning. Moreover, since the adjacent light-emitting elements may be separated by the spacers, the adjacent light-emitting elements do not affect the arrangement of each other. Moreover, since the adjacent light-emitting elements may be separated by the spacers, the problem of light mixing caused by the adjacent light-emitting elements when emitting light may be improved, or the light quality of the image may be improved. Based on the above, the display device is capable of having good display quality.

What is claimed is:

1. A display device, comprising:
    a subpixel region having a first region and a second region;
    a spacer disposed on a substrate and having a first opening and second opening, wherein the spacer separates the first region and the second region, the first opening corresponds to and overlaps the first region, and the second opening corresponds to and overlaps the second region;
    a light-emitting element located in at least one of the first region and the second region; and
    a driving circuit electrically connected to the first region and the second region to drive the light-emitting element.

2. The display device according to claim 1, wherein the light-emitting element is a light-emitting diode.

3. The display device according to claim 1, wherein both of the first region and the second region respectively accommodate the light-emitting element.

4. The display device according to claim 3, wherein one of the light-emitting element accommodated in the first region and the light-emitting element accommodated in the second region is no good (NG).

5. The display device according to claim 4, wherein the driving circuit is not electrically connected to the one of the light-emitting element which is no good.

6. The display device according to claim 1, wherein the spacer surrounds the first region and the second region.

7. The display device according to claim 1, wherein the spacer is discontinuous.

8. The display device according to claim 1, wherein the spacer comprises a wall portion, and the wall portion is disposed between the first region and the second region.

9. The display device according to claim 8, wherein the spacer further comprises a main body portion, the main body portion and the wall portion are connected as an integral structure, and the main body portion and the wall portion surround the first region and the second region.

10. The display device according to claim 9, wherein the light-emitting element is disposed in at least one of the first region and the second region surrounded by the main body portion and the wall portion.

11. The display device according to claim 1, wherein a total number of light-emitting elements which the subpixel region is capable of accommodating is greater than or equal to a sum of a number of light-emitting elements accommodated in the first region and a number of light-emitting elements accommodated in the second region.

12. The display device according to claim 1, wherein a number of the light-emitting element accommodated in the first region is greater than or equal to 1, and a number of light-emitting element accommodated in the second region is greater than or equal to 0.

13. The display device according to claim 1, wherein a pitch between the subpixel regions is greater than or equal to 1 micrometer and is less than or equal to 1200 micrometers.

14. The display device according to claim 1, wherein in a top view, a total area of the first region and the second region is less than or equal to an area of the subpixel region.

15. The display device according to claim 1, wherein in a top view, an area of the first region is substantially the same as an area of the second region.

16. A manufacturing method of a display device, comprising:

providing a substrate, wherein the substrate comprises a subpixel region having a first region and a second region and a driving circuit electrically connected to the subpixel region;

forming a spacer having a first opening and second opening on the substrate, wherein the spacer separates the first region and the second region, the first opening corresponds to and overlaps the first region, and the second opening corresponds to and overlaps the second region;

transferring at least one light emitting element to at least one of the first region and the second region, and the at least one light emitting element electrically connected to the driving circuit; and performing a defect inspection, wherein the defect inspection comprises inspecting the one of the plurality of the light-emitting elements transferred to the substrate.

17. The method according to claim 16, further comprising:

performing a repair transfer process after performing the defect inspection, wherein the repair transfer process comprises transferring another one of the plurality of the light-emitting elements to the other one of the first region or the second region of the subpixel region.

18. The method according to claim 17, wherein the transfer process is selective transfer or mass selective transfer.

* * * * *